(12) United States Patent
Zur

(10) Patent No.: US 11,440,151 B2
(45) Date of Patent: Sep. 13, 2022

(54) MILLING A MULTI-LAYERED OBJECT

(71) Applicant: APPLIED MATERIALS ISRAEL LTD., Rehovot (IL)

(72) Inventor: Yehuda Zur, Rehovot (IL)

( * ) Notice: Subject to any disclaimer, the term of this patent is extended or adjusted under 35 U.S.C. 154(b) by 680 days.

(21) Appl. No.: 16/435,367

(22) Filed: Jun. 7, 2019

(65) Prior Publication Data

US 2020/0384592 A1 Dec. 10, 2020

(51) Int. Cl.
| | |
|---|---|
| *H01J 37/08* | (2006.01) |
| *B23Q 15/22* | (2006.01) |
| *B23Q 1/70* | (2006.01) |
| *H01J 37/305* | (2006.01) |
| *B23Q 1/30* | (2006.01) |
| *B27C 5/00* | (2006.01) |

(52) U.S. Cl.
CPC ............ *B23Q 15/225* (2013.01); *B23Q 1/30* (2013.01); *B23Q 1/706* (2013.01); *B27C 5/00* (2013.01); *H01J 37/3056* (2013.01); *H01J 2237/3114* (2013.01); *H01J 2237/31749* (2013.01)

(58) Field of Classification Search
CPC ................ H01J 2237/31749; H01J 2237/3114
See application file for complete search history.

(56) References Cited

U.S. PATENT DOCUMENTS

| | | | |
|---|---|---|---|
| 5,035,770 A | 7/1991 | Braun | |
| 5,541,411 A | 7/1996 | Lindquist et al. | |
| 5,616,921 A | 4/1997 | Talbot et al. | |
| 5,752,309 A | 5/1998 | Partee et al. | |
| 5,952,658 A | 9/1999 | Shimase et al. | |
| 6,359,254 B1 | 3/2002 | Brown | |
| 6,414,307 B1 | 7/2002 | Gerlach et al. | |
| 6,497,194 B1 | 12/2002 | Libby et al. | |
| 6,670,610 B2 | 12/2003 | Shemesh et al. | |
| 10,971,618 B2 | 4/2021 | Davidescu et al. | |
| 2002/0074494 A1 | 6/2002 | Lundquist et al. | |
| 2003/0098416 A1 | 5/2003 | Shemesh et al. | |
| 2004/0140438 A1 | 7/2004 | Gerlach et al. | |

(Continued)

FOREIGN PATENT DOCUMENTS

| | | |
|---|---|---|
| KR | 10-1999-0036438 A | 5/1999 |
| KR | 10-2012-0109641 A | 10/2012 |
| WO | 2018/052424 A1 | 3/2018 |

OTHER PUBLICATIONS

International Search Report and Written Opinion of the International Searching Authority for Application No. PCT/US2020/032880, dated Sep. 7, 2020, 9 pages.

(Continued)

*Primary Examiner* — Joseph L Williams
(74) *Attorney, Agent, or Firm* — Kilpatrick Townsend & Stockton LLP

(57) ABSTRACT

A miller, a non-transitory computer readable medium, and a method for milling a multi-layered object. The method may include (i) receiving or determining milling parameters related to a milling process, the milling parameters may include at least two out of (a) a defocus strength, (b) a duration of the milling process, (c) a bias voltage supplied to an objective lens during the milling process, (d) an ion beam energy, and (e) an ion beam current density, and (ii) forming a crater by applying the milling process while maintaining the milling parameters, wherein the applying of the milling process includes directing a defocused ion beam on the multi-layered object.

20 Claims, 8 Drawing Sheets

(56) References Cited

U.S. PATENT DOCUMENTS

2005/0073775 A1    4/2005   Chang et al.
2015/0255248 A1    9/2015   Boguslavsky et al.
2018/0166304 A1    6/2018   Berry, III et al.
2021/0082664 A1    3/2021   Zur

OTHER PUBLICATIONS

International Search Report and Written Opinion of the International Searching Authority for Application No. PCT/US2020/041439, dated Oct. 23, 2020, 8 pages.
U.S. Appl. No. 16/530,331 Notice of Allowance dated Jan. 14, 2021, 8 pages.
U.S. Appl. No. 16/530,331 Corrected Notice of Allowability dated Mar. 11, 2021, 5 pages.
U.S. Appl. No. 16/573,139 Notice of Allowance dated Nov. 22, 2021, 10 pages.
International Preliminary Report on Patentability for Application No. PCT/US2020/032880, dated Dec. 16, 2021, 6 pages.
International Preliminary Report on Patentability for Application No. PCT/US2020/041439, dated Feb. 17, 2022, 5 pages.

92

93

91(11)

94

MILLING A MULTI-LAYERED OBJECT

BACKGROUND

Multi-layered objects such as various semiconductor objects (e.g. semiconductor wafers, display panels, solar wafers) may include multi-layers of microscopic scale. The dimensions (for example thickness) of the layers and the manner in which one layer is overlaid over another may be of interest.

There is a growing need to provide systems, non-transitory computer readable media and methods for evaluating multi-layered objects.

SUMMARY

There may be provided a method for milling a multi-layered object. The method may include (i) receiving or determining milling parameters related to a milling process, the milling parameters may include at least two out of (a) a defocus strength, (b) a duration of the milling process, (c) a bias voltage supplied to an objective lens during the milling process, (d) an ion beam energy, and (e) an ion beam current density, and (ii) forming a crater by applying the milling process while maintaining the milling parameters, wherein the applying of the milling process may include directing a defocused ion beam onto the multi-layered object.

There may be provided a non-transitory computer readable medium that stores instructions for: (i) receiving or determining milling parameters related to a milling process; wherein the milling parameters may include at least two out of (a) a defocus strength, (b) a duration of the milling process, (c) a bias voltage supplied to an objective lens during the milling process, (d) an ion beam energy, and (e) an ion beam current density; and (ii) forming a crater by applying the milling process while maintaining the milling parameters, wherein the applying of the milling process may include directing a defocused ion beam onto a multi-layered object.

There may be provided a miller that may include a controller and a focused ion beam column. The controller may be configured to receive or determine milling parameters related to a milling process. The milling parameters may include at least two out of (a) a defocus strength, (b) a duration of the milling process, (c) a bias voltage supplied to an objective lens during the milling process, (d) an ion beam energy, and (e) an ion beam current density. The focused ion beam column may be configured to form a crater by applying the milling process while maintaining the milling parameters. The applying of the milling process may include directing a defocused ion beam onto the multi-layered object.

BRIEF DESCRIPTION OF THE DRAWINGS

Examples of claimed subject matter may be particularly pointed out and distinctly claimed in the concluding portion of the specification. Embodiments of the present disclosure, however, both as to organization and method of operation, together with objects, features, and advantages thereof, may best be understood by reference to the following detailed description when read with the accompanying drawings in which:

Figure 1:
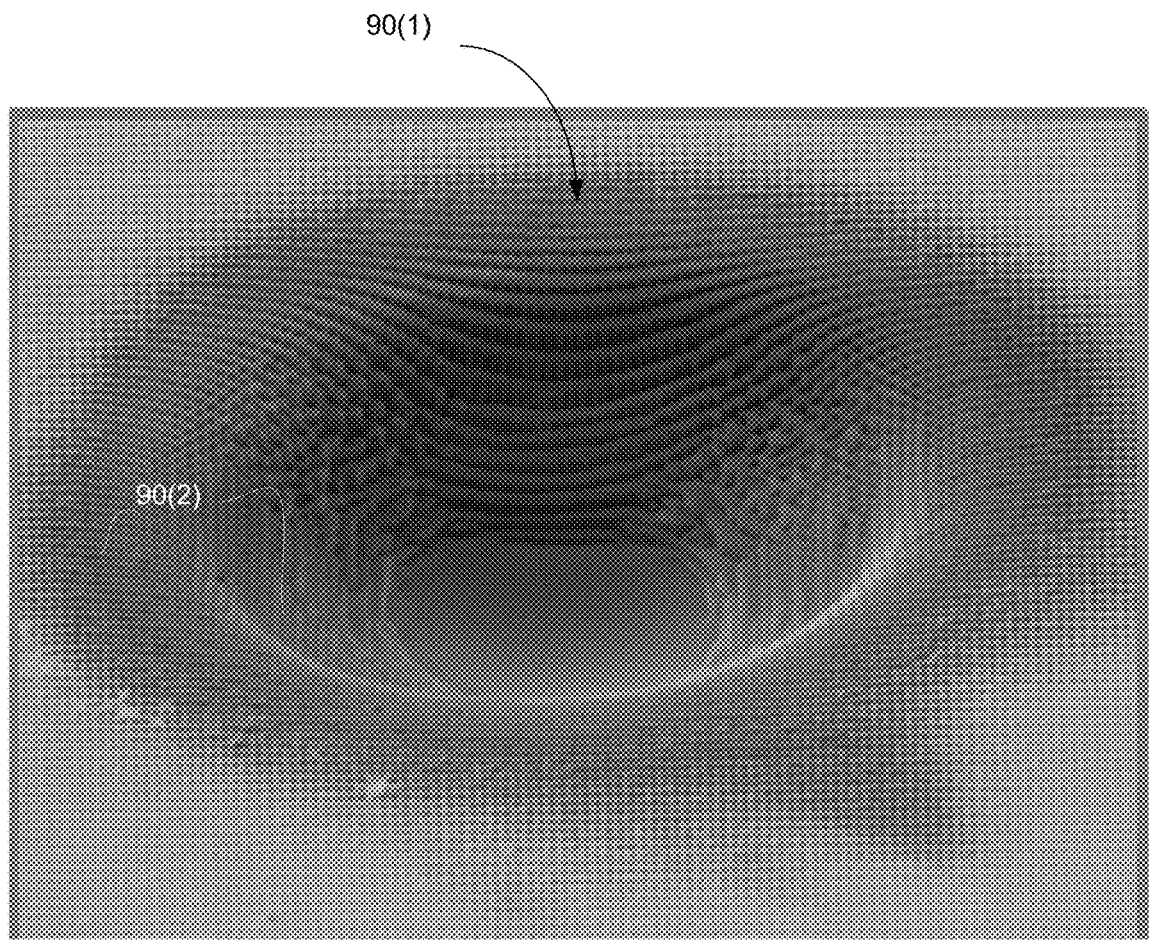
FIG. 1 is an example of an image of a crater formed in multi-layered object using a focused ion beam.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments of the present disclosure. However, it will be understood by those skilled in the art that the present embodiments of the present disclosure may be practiced without these specific details. In other instances, well-known methods, procedures, and components have not been described in detail so as not to obscure the present embodiments of the present disclosure.

The subject matter regarded as the embodiments of the present disclosure is particularly pointed out and distinctly claimed in the concluding portion of the specification. The embodiments of the present disclosure, however, both as to organization and method of operation, together with objects, features, and advantages thereof, may best be understood by reference to the following detailed description when read with the accompanying drawings.

Because the illustrated embodiments of the present embodiments of the present disclosure may for the most part, be implemented using electronic components and circuits known to those skilled in the art, details will not be explained in any greater extent than that considered necessary as illustrated above, for the understanding and appreciation of the underlying concepts of the present embodiments of the present disclosure and in order not to obfuscate or distract from the teachings of the present embodiments of the present disclosure.

Any reference in the specification to a method should be applied mutatis mutandis to a miller capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the miller.

Any reference in the specification to a non-transitory computer readable medium should be applied mutatis mutandis to a miller capable of executing the instructions stored in the non-transitory computer readable medium and should be applied mutatis mutandis to method that may be executed by a computer that reads the instructions stored in the non-transitory computer readable medium.

There may be provided a miller, a method and a non-transitory computer readable medium for milling a multi-layered object. The milling involves applying a milling process that may include directing a defocused ion beam onto a surface of the multi-layered object. The milling may involve using the unfocused ion beam to form a crater with diagonal edges. Milling using a high current unfocused ion beam may form a diagonal exposed surface of the multi-layered object at a fraction of the time required for forming a exposed surface using a focused lower current ion beam that follows a three dimensional scan pattern.

Various milling parameters of the milling process may be determined based on the materials that are about to be milled, the desired dimensions and the smoothness of the crater formed by the milling.

The milling parameters may include at least two out of the defocus strength, the duration of the milling, the bias voltage supplied to an objective lens, the ion beam energy, the current density of the ion beam.

The diameter of the crater may be dependent on the beam energy, the current density of the ion beam and defocusing strength. The depth of the crater may be dependent on the beam energy, current density, exposure times and the materials that are milled.

A mapping between the milling parameters of the milling and the crater parameters may be learned in one or more manners. For example—the mapping may be based on actual milling operations that are executed while applying different milling parameters. Only a part of all possible combinations of milling parameters values may be tested. Yet for another example—the milling operations may be based on simulations or other estimates of the milling—even without performing any milling.

The defocusing may be obtained in various manner—for example by adding a bias voltage to an objective lens of a focused ion beam column of the miller. The bias voltage may be a fraction (for example—less than one percent, less than five percent—or any other value) of the acceleration voltage used to accelerate the charged particle beam towards the sample.

Figure 2:
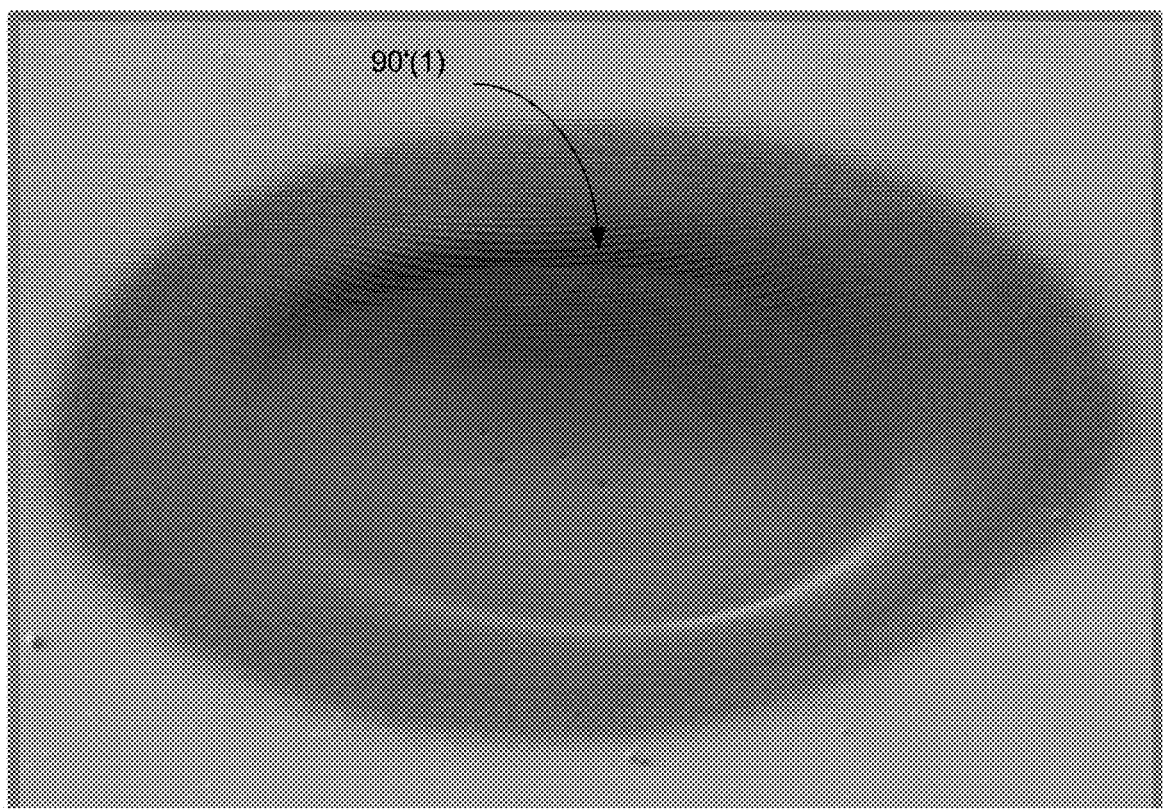
FIG. 2 is an example of an image of a crater formed in multi-layered object using a defocused ion beam.
Figure 3:
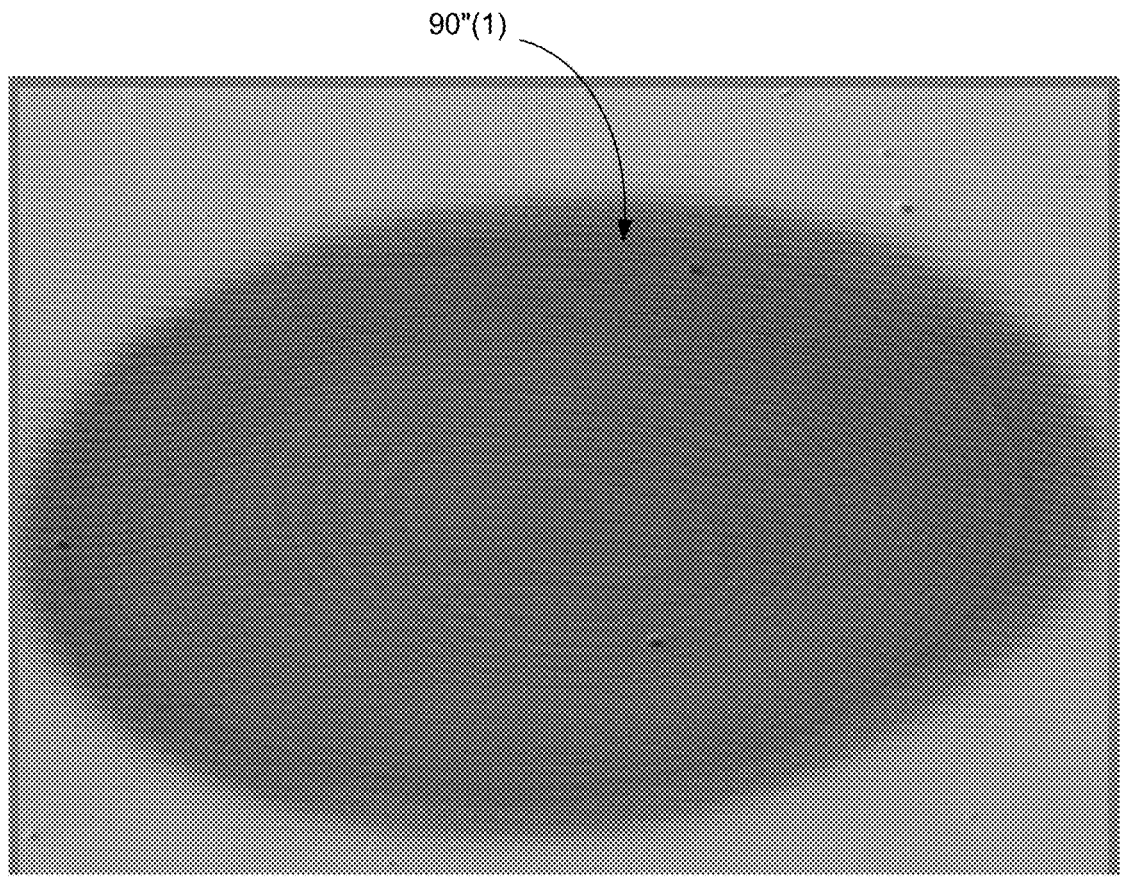
FIG. 3 is an example of an image of a crater formed in multi-layered object using a defocused ion beam.
Figure 4:
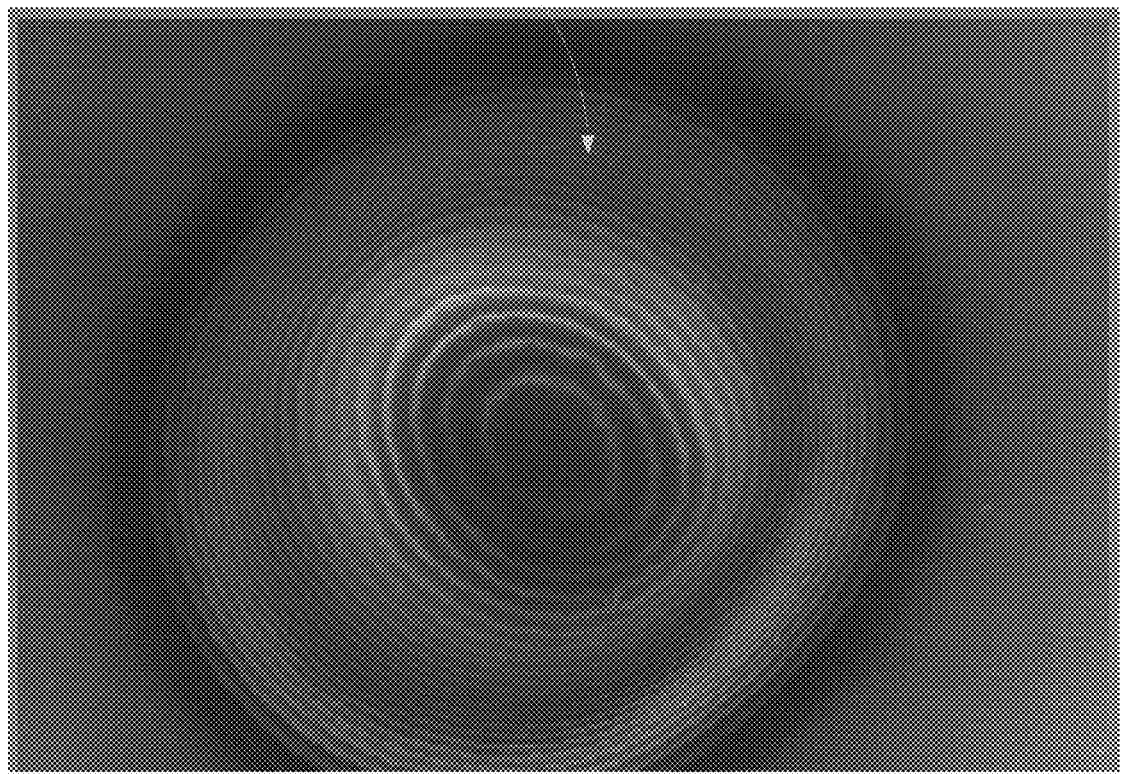
FIG. 4 is an example of an image of a crater formed in multi-layered object using a defocused ion beam.

Non-limiting examples of milling parameters and crater parameters are listed below. It is assumed that the multi-layered object has alternating oxide-nitride layers that are formed above a silicon bulk. The aggregate thickness of the alternating oxide-nitride layers is about five microns. Other dimensions and other materials may be used.

a. A focused Xe beam having a beam energy of 30 keV, a probe current of 300 nA, an objective lens voltage of about 17 kV and time of exposure of five seconds—yielded in a formation of a crater 90(1) that was rough (see FIG. 1), and has a bottom that was shaped as an inner circle (exposed silicon bulk) having a diameter of 5 microns. Before the formation of the crater, the object included holes 90(2) that passed through the multiple layers and reached a silicon substrate. The holes were exposed at different depths by the formation of the crater. The holes 90(2) are extremely small and are indicated by reference numbers 90(2), but may not be directly visible in FIG. 1. Crater 90(1) is shown in image 91 of FIG. 1.

b. Adding a bias voltage of 200 volts to the objective lens and increasing the exposure to ten seconds yielded in a formation of a crater 90'(1) that was smooth (see image 92 of FIG. 2), has a diameter of 40 microns and has a bottom that was shaped as an inner circle having a diameter of 10 microns. The images of FIGS. 1 and 2 are scanning electron images acquired at the same conditions. For example—same voltage, same working distance, same tilt angle). Nevertheless—image 92 of FIG. 2 was acquired at field of view that is twice the field view of image 91.

c. Adding a bias voltage of 400 volts to the objective lens and increasing the exposure to fifteen seconds yielded in a formation of a crater 90"(1) (see image 93 of FIG. 3) that was smooth, has a diameter of 75 microns—but has a bottom that does not reach the silicon bulk. Image 93 of FIG. 3 (as well as image 91 of FIG. 1, and image 92 of FIG. 2) may be processed using image processing for determining depth information related to the pixels of the image. Multiple layers may be detected using edge detection and/or contrast analysis.

d. Adding a bias voltage of 600 volts to the objective lens and increasing the exposure to sixty seconds yielded in a formation of a crater 91(11) of FIG. 4 (see image 94) that was smooth, has a diameter of 100 microns and has a bottom that was shaped as an inner circle having a diameter of 20 microns.

The crater may expose structural elements formed in one or more of the exposed layers and the critical dimensions of these structural elements may be measured using, for example, a critical dimension scanning electron microscope (CDSEM). A non-limiting example of such structural elements may be holes (for example holes 90(2) of FIG. 1) formed in the one or more layers. The holes may pass through all the multiple layers. The holes may be filled or may be empty. The holes one filled may form conductive paths that are used in three dimensional NAND memory arrays.

The measurement of the critical dimensions of the structural elements may include (a) using contrast image analysis to identify different layers within each crater therefore mapping XY coordinates of different depths, and (b) image one or more structural elements at one or more depths (for example—using a CDSEM) to obtain statistics on structural elements critical dimensions at different depths.

The miller may include one or more detectors. The one or more detectors may acquire information about the crater—especially about the exposed layers that once milled form the crater. The formation of a smooth crater that has more moderate slopes may dramatically increase the accuracy of the obtained information—especially in comparison to a much noisier and inaccurate information obtained from a rough crater.

The information obtained from the one or more detectors may be used to generate a mapping between depths of the layers and the dimensions of the layers.

Because the diagonal exposed surface is curved and non-linear there may be non-linear relationships between (i) distances between pixels of an image of the crater and (ii) depth associated with these pixels.

For example—assuming that the layers of the multi-layered object are of the same thickness—the distance between edges of different layers may differ from each other due to the non-linearity of the diagonal exposed surface.

This non-linear relationship may be learned in various manners—for example by evaluating images of craters of known dimensions within layers of known thickness. The crater may be symmetrical or unsymmetrical—and the image processing should compensate for changes in the symmetry level. The compensation may be based on images acquired of known references.

Accordingly—when milling using a defocused ion beam that has a non-linear slope—image processing should be applied to identify the different depths of the different layers.

Nevertheless—the depth of the crater can be controlled using calibration of the unfocused ion beam properties—for example by controlling the exposure time.

Therefore, the perfect (wanted) craters may be optimized per beam working point in terms of defocusing strength and per target materials in terms of exposure times.

Figure 5:
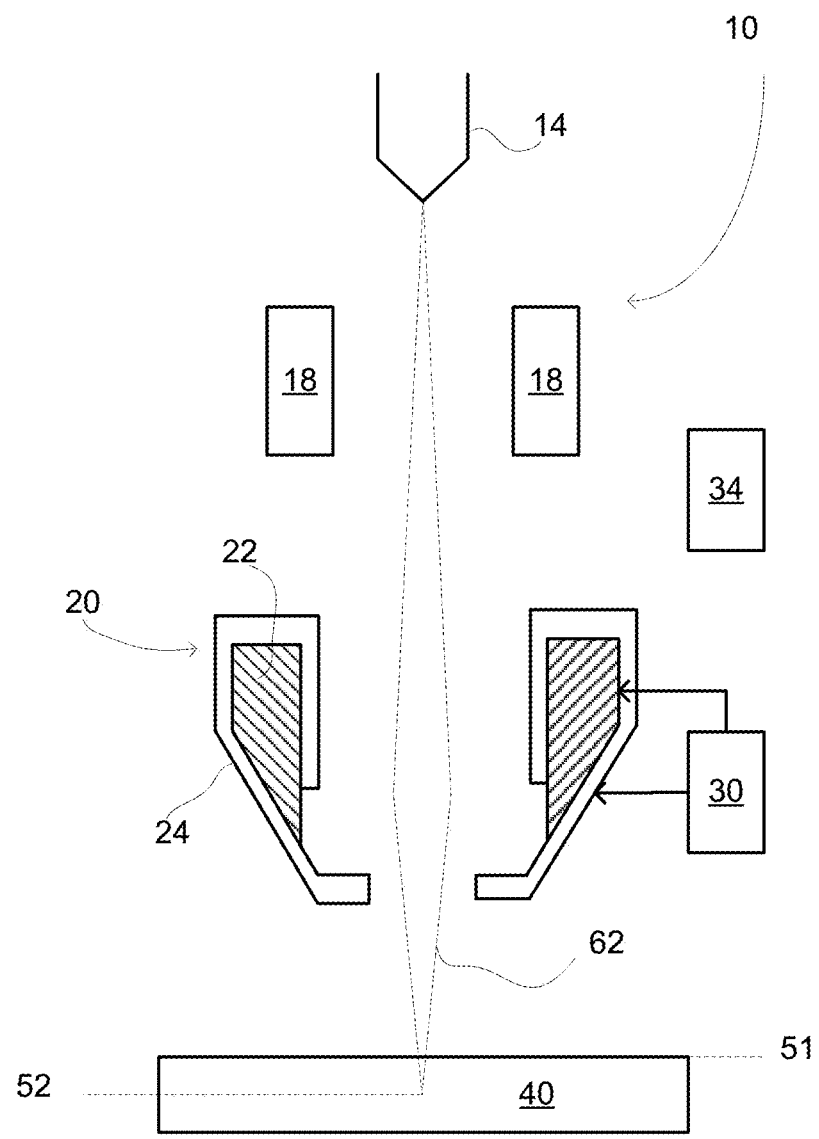
FIG. 5 is an example of a focused ion beam column.

FIG. 5 illustrates an example of a multi-layered object 40, such as a semiconductor wafer, and of a focused ion beam column 10 of a miller.

The focused ion beam column 10 includes a beam source 14, first lens 18, objective lens 20, power supply unit 30 and controller 34 for controlling the focused ion beam column 10.

The first lens 18 may be a condenser and/or a scanning lens.

Objective lens 20 may include a magnetic lens 22 and an electrostatic lens 24. The bias voltage may be applied to the electrostatic lens 24.

The focused ion beam column 10 may include additional optical elements, other optical elements, and the like.

The focused ion beam column 10 may generate an ion beam 62.

The ion beam 62 may be tilted, deflected once or multiple times, may impinge on the multi-layered object 40 at angles that may be normal to the multi-layered object 40 or an oblique angles.

FIG. 5 illustrates ion beam 62 that is focused by the objective lens 20 and reaches the upper surface (located in first plane 51) of the multi-layered object unfocused. The focus plane 52 is below the upper surface and below the crater (not shown). It should be noted that the focus plane may be above the upper surface.

The defocus strength, as well as other milling parameters may be controlled by controller 34.

Figure 6:
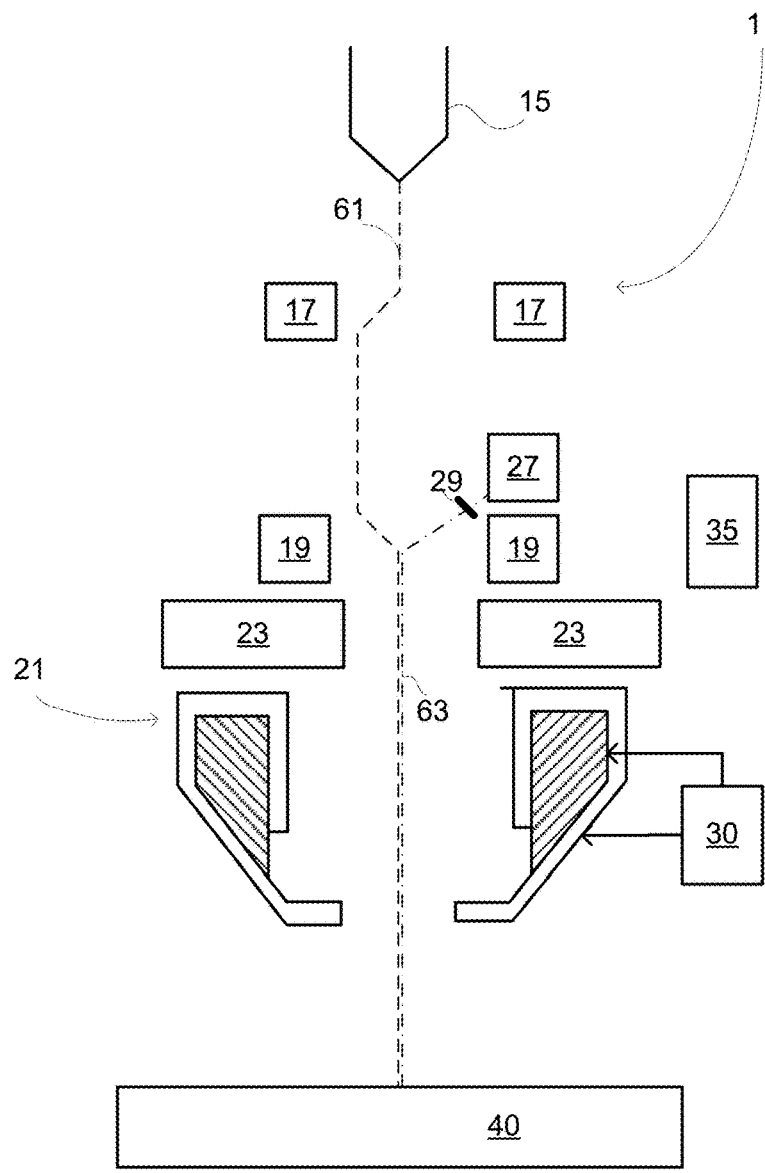
FIG. 6 is an example of a scanning electron microscope column.

FIG. 6 illustrates an example of a scanning electron microscope column (SEM column) 11 of the miller.

The SEM column 11 may include a beam source 15, first double-deflection lenses 17, second double deflection lenses 19, in-lens detector 23, additional detector 27, energy filter 29, objective lens 21, power supply unit 31, and controller 35 for controlling the SEM column 11.

Objective lens 21 may include a magnetic lens and an electrostatic lens. The bias voltage may be applied to the electrostatic lens.

The SEM column 11 may include additional optical elements, other optical elements, and the like. The primary electron beam 61 that impinges on the multi-layered object 40 may be tilted, deflected once or multiple times (for example four times—as illustrated in FIG. 6), may impinge on the multi-layered object 40 at angles that may be normal to the multi-layered object 40 or an oblique angles.

Electrons emitted from the multi-layered object 40 may reach energy filter 29 or may reach in-lens detector 23. In FIG. 6 the electrons that reach the energy filter 29 are denoted 63.

The energy filter 29 may selectively pass to additional detector 27, electrons of energy that exceeds a threshold that is set by the energy filter 29. Change of the threshold may allow electrons of different energies to reach additional detector 27.

SEM column 11 may include any combinations of detectors.

Figure 7:
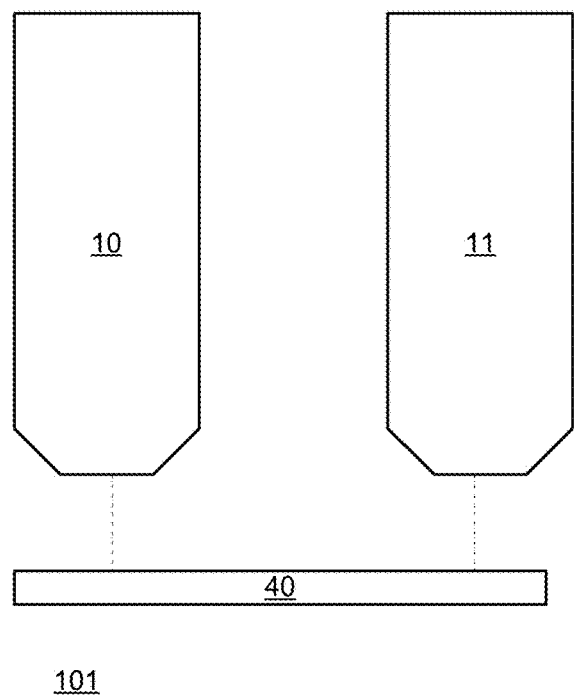
FIG. 7 illustrates examples of a miller.
Figure 7:
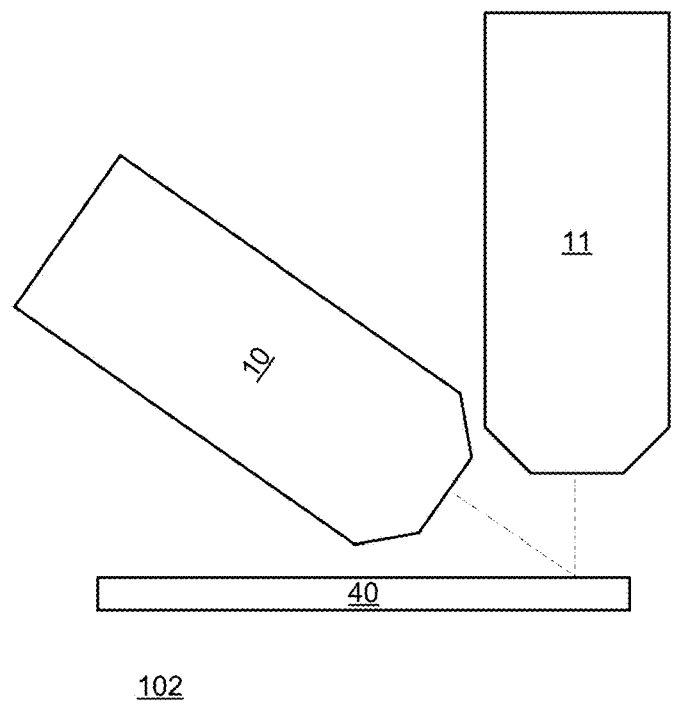

FIG. 7 illustrates two example of imagers and multi-layered object 40.

In a first imager 101 the SEM column 11 and the focused ion beam column 10 are parallel to each other. In a second imager 102, the SEM column 11 and the focused ion beam column 10 are oriented to each other.

It should be noted that one of the columns or both columns may be tilted in relation to the other columns and/or in relation to the multi-layered object 40.

Figure 8:
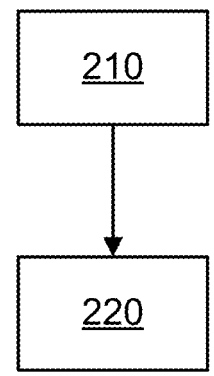
FIG. 8 illustrates an example of a method.

FIG. 8 illustrates an example of method 200.

Method 200 may include steps 210 and 220.

Step 210 may include receiving or determining milling parameters related to a milling process.

The milling parameters may include at least some of the following: (a) a defocus strength, (b) a duration of the milling process, (c) a bias voltage supplied to an objective lens during the milling process, (d) an ion beam energy, and (e) an ion beam current density.

Step 220 may include forming a crater by applying the milling process while maintaining the milling parameters, wherein the applying of the milling process may include directing a defocused ion beam on the multi-layered object.

Step 210 may include receiving crater parameters and determining the milling parameters based on the crater parameters.

The crater parameters may include one or more materials of the multi-layered object that are milled by the milling process, and spatial parameters that define at least two out of shape and size of the crater.

Step 210 may include determining the milling parameters based on a mapping between the milling parameters and the crater parameters.

Step 210 may include determining the mapping based on test milling processes applied using different milling parameters.

Regarding the milling parameters
  a. The defocus strength affects a size of the crater, a shape of the crater and the current density of the defocused ion beam. For example—stronger defocusing will result in a bigger crater, a more moderate sloped crater and in lower current density of the defocused ion beam.
  b. The duration of milling determines the depth of the crater.
  c. The objective lens bias voltage controls the defocus strength.
  d. Ion beam energy does not affect the defocusing but stronger ion beam energy allows the defocused ion beam to penetrate deeper and reduces surface deformation.
  e. The ion beam current does not determine the defocusing but determines the milling rate and the size of the crater. For example—higher ion beam current results in faster milling and larger craters.
  f. The shape of the crater and the size of the crater are affected by the ion beam energy and the ion beam current since changes in the ion beam current and the ion beam energy change the profile of the defocused ion beam.

The crater parameters may include one or more materials of the multi-layered object that are milled by the milling process, and spatial parameters that define at least two out of shape and size of the crater.

The crater parameter may be determined in any manner. For example—the crater parameters may be determined by a user, by an operator of the miller, and the like.

The mapping between the milling parameters and the crater parameter may be calculated by simulation, by actual milling of test craters, and the like.

Any of the charged particle beams may be taken at any tilt angle.

After milling 220, the method may further include collecting critical dimension (CD) measurements of the locations of interest in one or more of the multiple layers using the SEM column 11, processing the CD measurements and generating a three dimensional (3D) analysis of the object. The applying of the milling process may include milling in a spot or various spots on the object, milling along a scanning line or along any other milling path, milling in any area of the object, milling at or near opening of holes, and the like.

The embodiments of the present disclosure may also be implemented in a computer program for running on a computer system, at least including code portions for performing steps of a method according to the embodiments of the present disclosure when run on a programmable apparatus, such as a computer system or enabling a programmable apparatus to perform functions of a device or system according to the embodiments of the present disclosure. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the embodiments of the present disclosure has been described with reference to specific examples of embodiments of the present disclosure. It will, however, be evident that various modifications and changes may be made therein without departing from the broader spirit and scope of the embodiments of the present disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the present disclosure described herein are, for example, capable of operation in other orientations than those illustrated or otherwise described herein.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the embodiments of the present disclosure is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the present disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the present disclosure.

I claim:

1. A method for milling a multi-layered object, the method comprises:
    receiving or determining milling parameters related to a milling process; wherein the milling parameters comprise at least two out of (a) a defocus strength, (b) a duration of the milling process, (c) a bias voltage supplied to an objective lens during the milling process, (d) an ion beam energy, and (e) an ion beam current density; and
    forming a crater in the multi-layered object by applying the milling process while maintaining the milling parameters, wherein the applying of the milling process comprises directing a defocused ion beam onto the multi-layered object.

2. The method according to claim 1 comprising receiving crater parameters and determining the milling parameters based on the crater parameters.

3. The method according to claim 2 wherein the crater parameters comprise one or more materials of the multi-layered object that are milled by the milling process, and spatial parameters that define at least two out of shape and size of the crater.

4. The method according to claim 2 wherein the determining is based on a mapping between the milling parameters and the crater parameters.

5. The method according to claim 4 comprising determining the mapping based on test milling processes applied using different milling parameters.

6. The method according to claim 2 wherein the crater parameters comprise a smoothness of the crater.

7. The method according to claim 1 wherein the milling parameters comprise the defocus strength, the duration of the milling process, the bias voltage, the ion beam energy, and the ion beam current density.

8. The method according to claim 1 comprising acquiring a charged particle beam image of the crater and processing the charged particle beam image to determine depth information related to one or more layers exposed by the crater.

9. The method according to claim 8 wherein the processing comprises using a mapping between pixel locations in the charged particle beam image and depth information regarding the pixel locations.

10. The method according to claim 8 comprising determining critical dimensions related to one or more of the layers exposed by the crater.

11. The method according to claim 1, wherein the defocused ion beam has a focus plane below an upper surface of the multi-layered object or above the upper surface of the multi-layered object.

12. A miller that comprises a controller and a focused ion beam column;
    wherein the controller is configured to receive or determine milling parameters related to a milling process;
    wherein the milling parameters comprise at least two out of (a) a defocus strength, (b) a duration of the milling process, (c) a bias voltage supplied to an objective lens during the milling process, (d) an ion beam energy, and (e) an ion beam current density; and
    wherein the focused ion beam column configured to form a crater in a multi-layered object by applying the milling process while maintaining the milling parameters, wherein the applying of the milling process comprises directing a defocused ion beam on a multi-layered object.

13. The miller according to claim 12 wherein the controller is configured to receive crater parameters and determine the milling parameters based on the crater parameters.

14. The miller according to claim 13 wherein the crater parameters comprise one or more materials of the multi-layered object that are milled by the milling process, and spatial parameters that define at least two out of shape and size of the crater.

15. The miller according to claim 13 wherein the controller is configured to determine the milling parameters based on a mapping between the milling parameters and the crater parameters.

16. The miller according to claim 15 wherein the controller is configured to determine the mapping based on test milling processes applied using different milling parameters.

17. The miller according to claim 13 wherein the crater parameters comprise a smoothness of the crater.

18. The miller according to claim 13 wherein the milling parameters comprise the defocus strength, the duration of the milling process, the bias voltage, the ion beam energy, and the ion beam current density.

19. A non-transitory computer readable medium that stores instructions for:
  receiving or determining milling parameters related to a milling process; wherein the milling parameters comprise at least two out of (a) a defocus strength, (b) a duration of the milling process, (c) a bias voltage supplied to an objective lens during the milling process, (d) an ion beam energy, and (e) an ion beam current density; and
  forming a crater by applying the milling process while maintaining the milling parameters, wherein the applying of the milling process comprises directing a defocused ion beam on a multi-layered object.

20. The non-transitory computer readable medium according to claim 19 that stores instructions for receiving crater parameters and determining the milling parameters based on the crater parameters.

\* \* \* \* \*